United States Patent [19]
Benveniste

[11] Patent Number: 5,736,743
[45] Date of Patent: *Apr. 7, 1998

[54] METHOD AND APPARATUS FOR ION BEAM FORMATION IN AN ION IMPLANTER

[75] Inventor: Victor M. Benveniste, Gloucester, Mass.

[73] Assignee: Eaton Corporation, Cleveland, Ohio

[*] Notice: The term of this patent shall not extend beyond the expiration date of Pat. No. 5,554,857.

[21] Appl. No.: 696,122

[22] Filed: Aug. 13, 1996

Related U.S. Application Data

[63] Continuation of Ser. No. 545,135, Oct. 19, 1995, Pat. No. 5,554,857.
[51] Int. Cl.$^6$ .......................... H01J 37/317; H01J 49/30
[52] U.S. Cl. ........................ 250/492.21; 250/298
[58] Field of Search ................. 250/492.21, 396 ML, 250/298; 335/300

[56] References Cited

U.S. PATENT DOCUMENTS

| | | | |
|---|---|---|---|
| 2,932,738 | 4/1960 | Bruck | 250/298 |
| 3,356,976 | 12/1967 | Sampson et al. | 250/295 |
| 5,164,599 | 11/1992 | Benveniste | 250/492.2 |
| 5,282,899 | 2/1994 | Balmashnov et al. | 118/723 R |
| 5,389,793 | 2/1995 | Aitken et al. | 250/492.21 |
| 5,523,652 | 6/1996 | Sferlazzo et al. | 315/111.41 |
| 5,554,857 | 9/1996 | Benveniste | 250/492.21 |

OTHER PUBLICATIONS

Glavish, H.F., "Magnet Optics for Beam Transport," *Nuclear Instruments and Methods*, North–Holland Publishing Company, 189, pp. 43–53 (1981).

Wollnik, Hermann, *Optics of Charged Particles*, Academic Press, Inc., pp. 118–119, 280–285 (1987).

*Primary Examiner*—Jack I. Berman
*Attorney, Agent, or Firm*—Watts, Hoffmann, Fisher & Heinke, Co., L.P.A.

[57] ABSTRACT

A low energy ion implanter having an ion source for emitting ions and an implantation chamber spaced from the ion source by an ion beam path through which ions move from the source to the implantation chamber. A mass analyzing magnet positioned along the beam path between the source and the implantation chamber deflects ions through controlled arcuate paths to filter ions from the beam while allowing certain other ions to enter the ion implantation chamber. The magnet includes multiple magnet pole pieces constructed from a ferromagnetic material and having inwardly facing pole surfaces that bound at least a portion of a ion deflection region. One or more current carrying coils set up dipole magnetic fields in the deflection region near the pole pieces. Additional coils help set up a quadrapole field in deflection region. A controller electrically coupled to the one or more coils of said magnet for controls current through the one or more current carrying coils to create the magnetic field in the deflection region near the pole pieces.

46 Claims, 9 Drawing Sheets

METHOD AND APPARATUS FOR ION BEAM FORMATION IN AN ION IMPLANTER

This application is a continuation of application Ser. No. 08/545,135, filed Oct. 19, 1995 now U.S. Pat. No. 5,554,857.

FIELD OF INVENTION

The present invention concerns a method and apparatus for controlling ion beam generation in an ion beam implanter and, more particularly, to a method for using a magnetic field that adjusts the contents of the ion beam to remove unwanted ion species from the ion beam.

BACKGROUND OF THE INVENTION

Ion beam implanters are used to treat silicon wafers with an ion beam. Such treatment can be used to produce n or p type extrinsic materials doping or can be used to form passivation layers during fabrication of an integrated circuit.

When used for doping semiconductors, the ion beam implanter injects a selected ion species to produce the desired extrinsic material. Implanting ions generated from source materials such as antimony, arsenic or phosphorus results in 'n type' extrinsic material wafers. If 'p type' extrinsic material wafers are desired, ions generated with source materials such as boron, gallium or indium are implanted.

The ion beam implanter includes an ion source for generating positively charged ions from ionizable source materials. The generated ions are formed into a beam and accelerated along a predetermined beam path to an implantation station. The ion beam implanter includes beam forming and shaping structure extending between an ion source and the implantation station. The beam forming and shaping structure maintains the ion beam and bounds an elongated interior cavity or region through which the beam passes en route to the implantation station. When operating the implanter, this interior region must be evacuated to reduce the probability of ions being deflected from the predetermined beam path as a result of collisions with air molecules.

For high current ion implanters (approximately 5 milliamperes beam current), the wafers at the implantation station are mounted on a surface of a rotating support. As the support rotates, the wafers pass through the ion beam. Ions traveling along the beam path collide with and are implanted in the rotating wafers. A robotic arm withdraws wafers to be treated from a wafer cassette and positions the wafers on the wafer support surface. After treatment, the robotic arm removes the wafers from the wafer support surface and redeposits the treated wafers in the wafer cassette.

Eaton Corporation, assignee of the present invention, currently sells high current implanters under the product designations NV 10, NV-GSD/200, NV-GSD/160, and NV-GSD/80. Current versions of these model ion implanters include a sector magnet for the purpose of ion species selection. Different species ions are emitted from the ion source. These species have the same charge but have different masses. Current sector magnets produce a dipole magnetic field that disperses particles of different momentum-to-charge ratios to isolate the trajectories of the desired ion species. In addition to the dipole field, it is necessary to produce quadrapole fields within such magnets. These quadrapole fields confine the beam within a practical envelop, and focus the beam into a waist at a location along the beam line that includes a resolving aperture. Only ions having the correct mass remain within the beam downstream from the waist.

A 'correct' quadrapole magnetic field strength depends in part, on the tendency of the beam to diverge under the effect of its own space charge density, which depends on parameters such as beam current, energy, mass, as well as beamline parameters such as residual gas composition and pressure. Existing high current implanters must operate with a wide range of parameters, ideally requiring different amounts of focussing for optimal transmission of the ion beam and optimal mass selectivity.

Current sector magnets found in ion implanters are designed with fixed quadrapole focussing strength, selected for best operation with a nominal set of beam parameters. Outside these nominal conditions, particularly at very low energy (less than 10 kvolts) and high currents, the performance of these systems is significantly compromised.

DISCLOSURE OF THE INVENTION

The present invention produces primary focusing quadrapole fields that can be readily adjusted depending on other ion implanter parameters. An ion implanter constructed in accordance with the invention includes an ion source for emitting ions and an implantation chamber spaced from the ion source by ion implanter structure that defines an ion beam path through which ions move from the source to the implantation chamber.

The implanter includes a magnet positioned along the beam path between the source and the implantation chamber for deflecting ions through arcuate paths to filter unwanted particles from the ion beam. This magnet has first and second magnetic pole pieces constructed from a ferromagnetic material that have inwardly facing pole surfaces on opposite sides of a magnetic field region through which the ion beam moves. The magnet further includes one or more primary current carrying coils mounted in close proximity to the pole pieces. These primary coils create a primary dipole magnetic field in the magnetic field region between the inwardly facing pole surfaces of the first and second magnetic pole pieces that bends the charged particles along arcuate paths through the magnetic field region.

Quadrapole field focussing is performed by one or more additional current carrying coils for providing electric currents that also bound the arcuate paths through which the ions bend. These quadrapole fields are superimposed on the dipole field in the region between the pole pieces.

The strength of both the quadrapole and dipole fields are adjusted by a controller electrically coupled to the primary and additional current carrying coils of said magnet.

A magnet constructed in accordance with the invention adds flexibility to the implanter. This flexibility allows the implanter to be used with different species ions at low energy implant levels. These and other objects, advantages and features of the invention will be understood by reference to the detailed description of a preferred embodiment of the invention when described in conjunction with the accompanying drawings.

DETAILED DESCRIPTION

Figure 1:
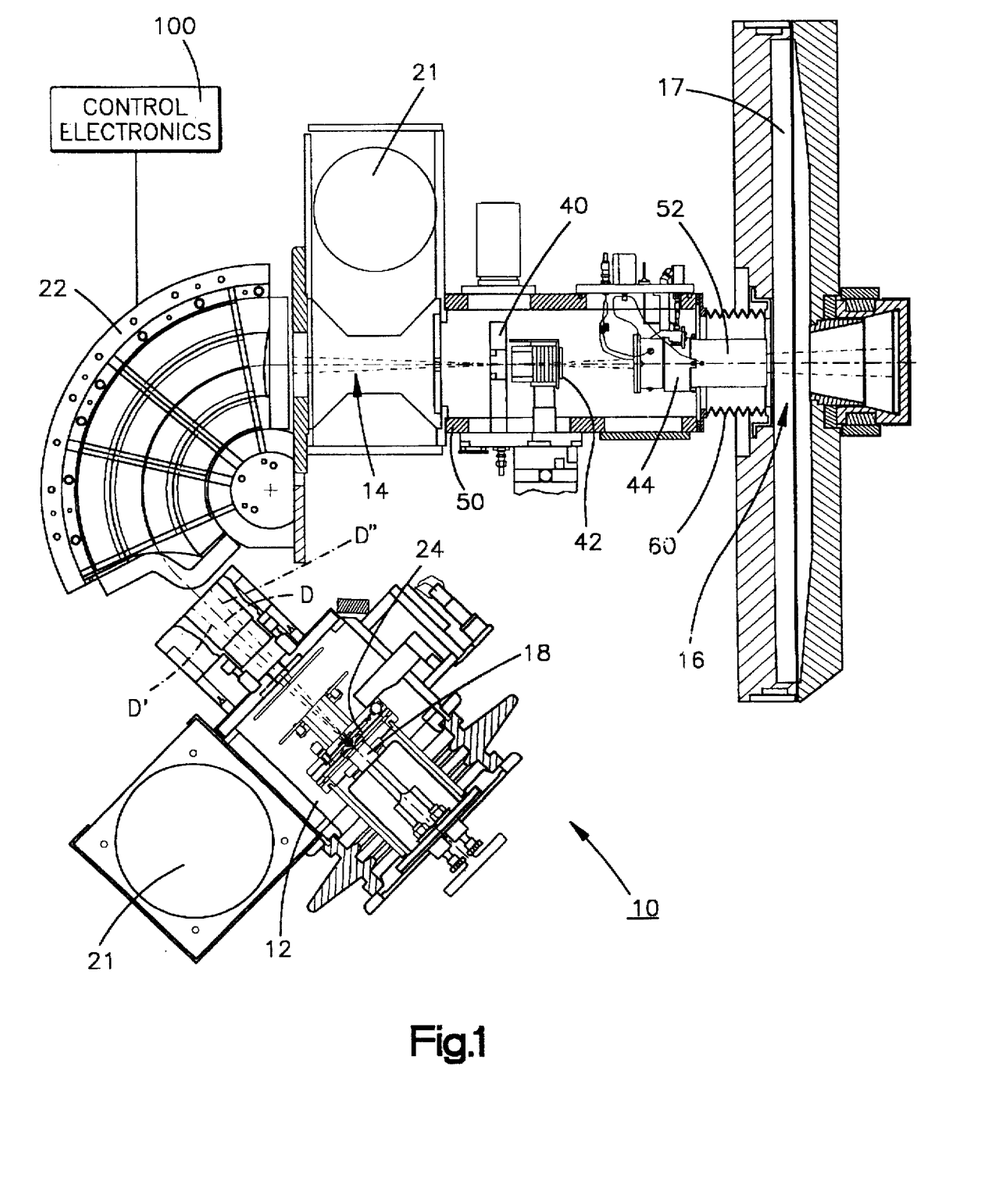
FIG. 1 is a side elevation view, partly in section, showing an ion beam implanter including an ion source, beam forming and shaping structure and an implantation chamber.

Turning now to the drawings, FIG. 1 depicts an ion beam implanter, shown generally at 10, which includes an ion source 12 for providing ions that form an ion beam 14 which traverses a beam path to an implantation station 16. Control electronics (not shown) are provided for monitoring and controlling the ion dosage received by the wafers (not shown) within an implantation chamber 17 at the implantation station 16. The ions in the ion beam follow a predetermined, desired beam path labeled "D" in FIG. 1. The beam path D has varying amounts of divergence as the beam traverses the distance between the ion source 12 and the implantation station 16. The "limits" of the predetermined beam path D caused by beam divergence have been labeled D' and D" respectively in FIG. 1.

The ion source 12 includes a plasma chamber 18 defining an interior region into which source materials are injected. The source materials may include an ionizable gas or vaporized source material. Source material in solid form is deposited into a vaporizer which is then injected into the plasma chamber 18. If an n type extrinsic wafer material is desired, boron, gallium or indium will be used. Gallium and indium are solid source materials, while boron is injected into the plasma chamber 18 as a gas, typically boron trifluoride or diborane, because boron's vapor pressure is too low to result in a usable pressure by simply heating it.

If a p type extrinsic material is to be produced, antimony, arsenic or phosphorus will be chosen as the solid source material. Energy is applied to the source materials to generate positively charged ions in the plasma chamber 18. The positively charged ions exit the plasma chamber interior through an elliptical arc slit in a cover plate overlying an open side of the plasma chamber 18.

An ion source utilizing microwave energy to ionize source materials is disclosed in U.S. patent application Ser. No. 08/312,142, filed Sept. 26, 1994, now U.S. Pat. No. 5,523,652 which is assigned to the assignee of the instant application. U.S. patent application Ser. No. 08/312,142 is incorporated herein in its entirety by reference. The ion beam 14 travels through an evacuated path from the ion source 12 to an implantation chamber 17, which is also evacuated. Evacuation of the beam path is provided by vacuum pumps 21.

Ions in the plasma chamber 18 are extracted through the arc slit in the plasma chamber cover plate and accelerated toward a mass analyzing magnet 22 by a set of electrodes 24 adjacent the plasma chamber. The set of electrodes 24 extract the ions from the plasma chamber interior and accelerate the ions into a region bounded by the mass analyzing or resolving magnet 22. An ion beam path through the magnet is bounded by an aluminum beam guide 26.

Ions that make up the ion beam 14 move from the ion source 12 into a magnetic field set up by the mass analyzing magnet 22. The strength and orientation of the magnetic field produced by the magnet 22 is controlled by the control electronics 100 by adjusting a current through the magnet's field windings.

The mass analyzing magnet 22 causes only those ions having an appropriate mass to charge ratio to reach the ion implantation station 16. The ionization of source materials in the plasma chamber 18 generates a species of positively charged ions having a desired atomic mass. However, in addition to the desired species of ions, the ionization process will also generate a proportion of ions having other than the proper atomic mass. Ions having an atomic mass above or below the proper atomic mass are not suitable for implantation.

The magnetic field generated by the mass analyzing magnet 22 causes the ions in the ion beam to move in a curved trajectory. The magnetic field is established by the control electronics 100 is such that only ions having an atomic mass equal to the atomic mass of the desired ion species traverse the beam path to the implantation station chamber 17.

Located downstream from the magnet is a resolving plate 40. The resolving plate 40 is comprised of vitreous graphite and defines an elongated aperture through which the ions in the ion beam 14 pass. At the resolving plate 40 the ion beam dispersion, as defined by the width of the envelope D', D", is at a minimum value.

The resolving plate 40 functions in conjunction with the mass analyzing magnet 22 to eliminate undesirable ion species from the ion beam 14 which have an atomic mass close to, but not identical, to the atomic mass of the desired species of ions. As explained above, the strength and orientation of the mass analyzing magnet's magnetic field is established by the control circuitry such that only ions having an atomic weight equal to the atomic weight of the desired species will traverse the predetermined, desired beam path D to the implantation station 16. Undesirable species of ions having an atomic mass much larger or much smaller than the desired ion atomic mass are sharply deflected and impact the beam guide 26 or the slit boundary defined by the resolving plate 40.

As can be seen in FIG. 1, a Faraday flag 42 is located between the resolving aperture 40 and an ion beam neutralizer 44. The Faraday flag is pivotably coupled to a housing 50 so that it can be pivoted into position to intersect the ion beam 14 to measure beam characteristics and, when the measurements are satisfactory, swung out of the beam line so as to not interfere with wafer implantation at the implantation chamber 17.

The beam forming structure 13 also includes the ion beam neutralization apparatus 44, commonly referred to as an electron shower. U.S. Pat. No. 5,164,599 to Benveniste, issued Nov. 17, 1992, discloses an electron shower apparatus in an ion beam implanter and is incorporated herein in its entirety by reference. The ions extracted from the plasma chamber 18 are positively charged. If the positive charge on the ions is not neutralized prior to implantation of the wafers, the doped wafers will exhibit a net positive charge. As described in the '599 patent, such a net positive charge on a wafer has undesirable characteristics.

A downstream end of the neutralizer's extension tube 52 is adjacent the implantation chamber 17 where the wafers are implanted with ions. Rotatably supported within the implantation chamber is a disk shaped wafer support (not shown). Wafers to be treated are positioned near a peripheral edge of the wafer support and the support is rotated by a motor (not shown) at about 1200 RPM. The ion beam 14 impinges and treats the wafers as they rotate in a circular path. The implantation station 16 is pivotable with respect to the housing 50 and is connected to the housing 50 by a flexible bellows 60 (FIG. 1). The ability to pivot the implantation station 16 permits adjustments to the angle of incidence of the ion beam 14 on the wafers.

Sector Magnet 22

Referring to FIGS. 2–15, the magnet 22 deflects ions through arcuate paths to filter particles having an incorrect charge to mass ratio from the ion beam. The magnet includes first and second multi-segment magnetic pole pieces 110, 112 (FIGS. 2 and 3) constructed from a ferromagnetic material. The pole pieces have inwardly facing pole surfaces 114, 116 spaced apart by a four sided magnetic field region 120 (FIG. 3) through which the ion beam 14 moves. The pole pieces are outside the beam guide 26 that defines the vacuum region through which the ions move on their way to the ion implantation chamber. Since the beam guide is constructed from a magnetically permeable material, i.e. aluminum the presence of the guide does not adversely affect the magnetic field in the region 120.

Figure 2:
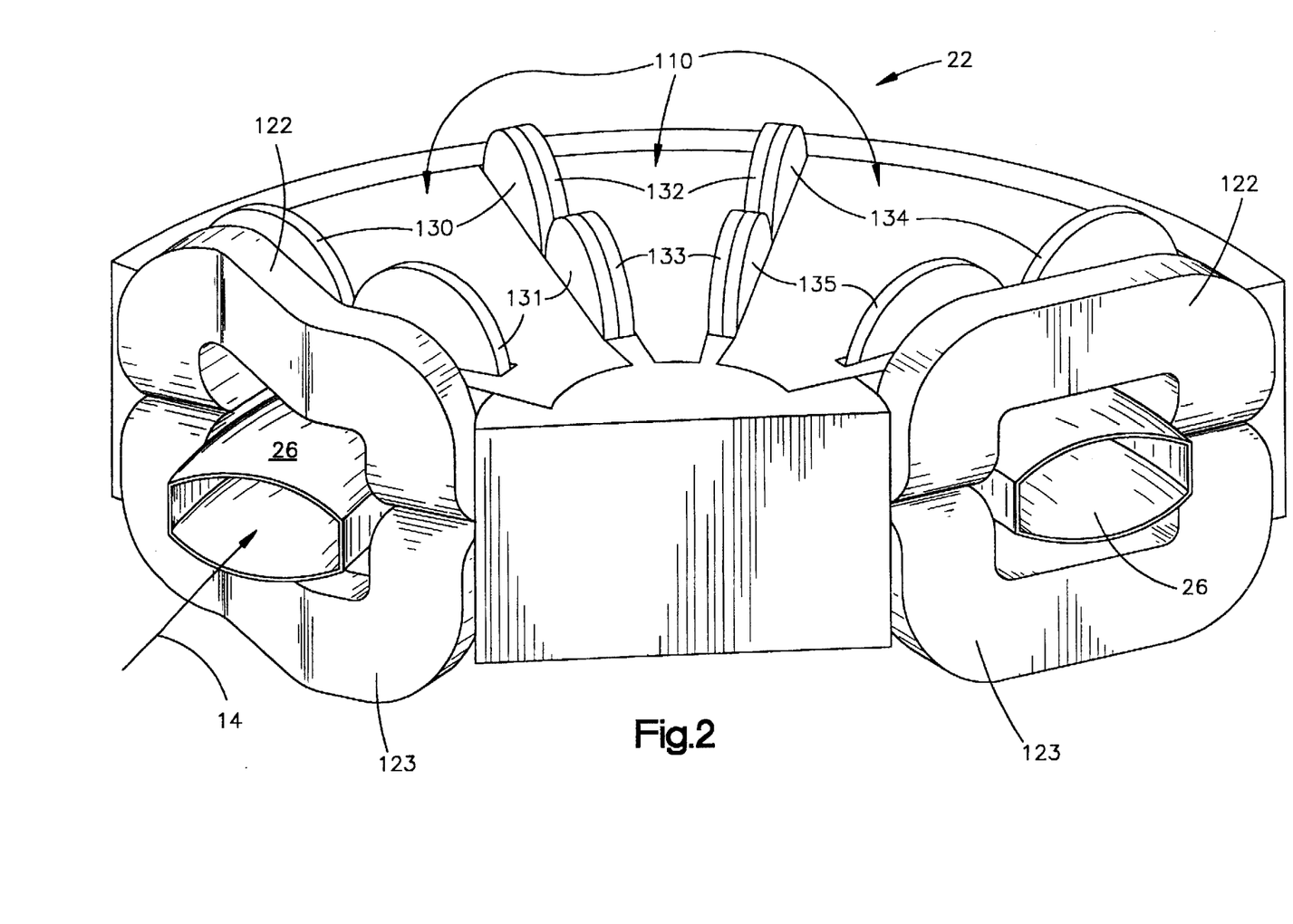
FIG. 2 is a perspective view of a magnet used in controlling transmission of appropriate charge to mass ratio particles from the ion source to the implantation chamber.
Figure 3:
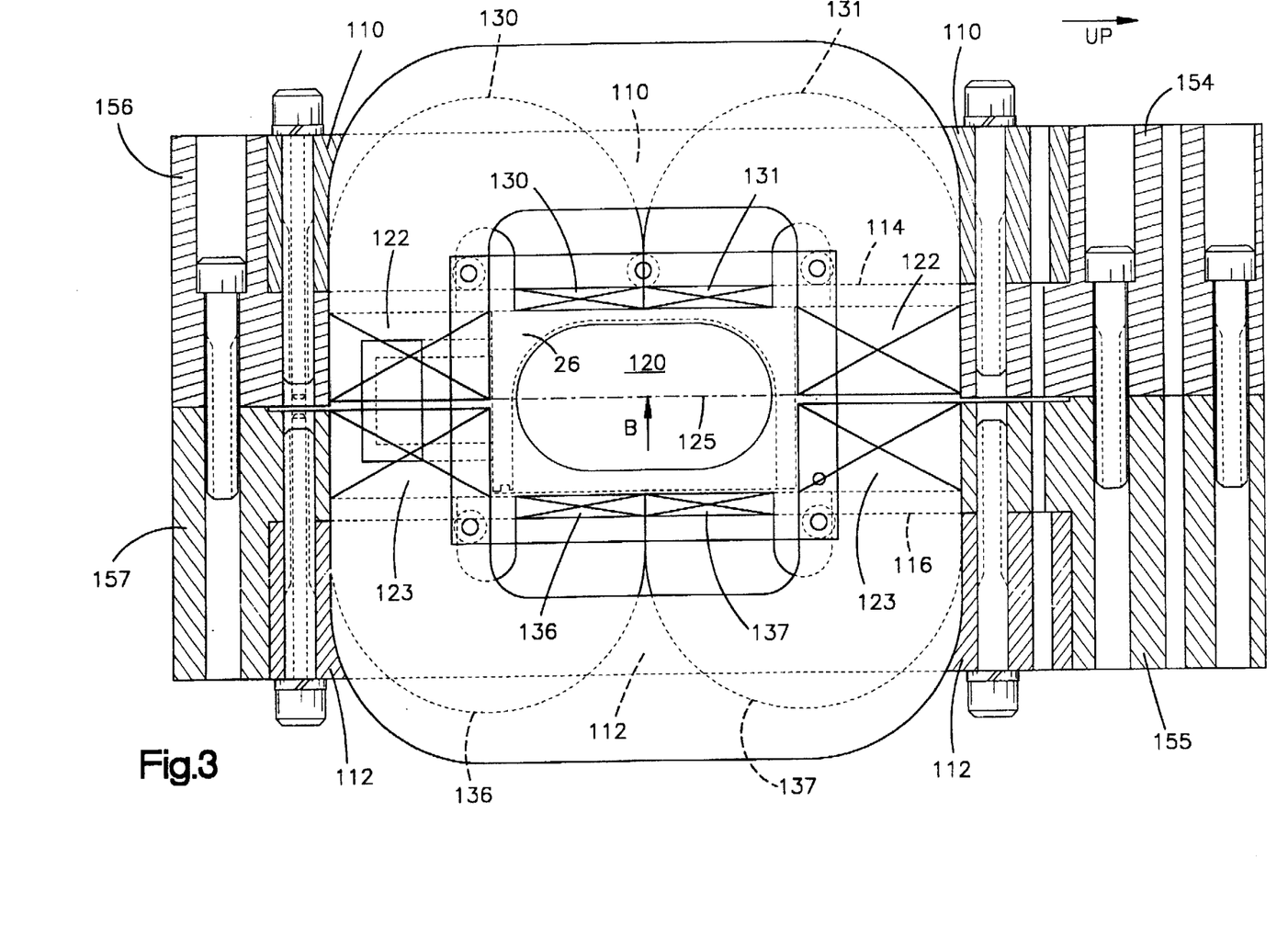
FIG. 3 is a schematic depiction of the magnet depicted in FIG. 2.

The ions exiting the ion source 12 experience a strong electric field set up by the extraction electrodes 24 that accelerates ions into the magnet 22. The pole pieces are oriented with the inwardly facing pole surfaces 114, 116 in spaced apart vertical planes with respect to an ion implanter base.

Two primary current carrying coils 122, 123 bound the arcuate ion beam path on opposite sides of a magnet centerplane 125 that bisects the magnetic field region 120. In this discussion, points on the y=0 co-ordinate are located on this centerplane 125. The ferro-magnetic pole pieces 110, 112 and current through the coils 122, 123 set up a primary dipole magnetic field B0 in the magnetic field region 120 between the inwardly facing, vertically oriented pole surfaces 114, 116 of the first and second magnetic pole pieces. This field B0 bends the charged particles along arcuate paths through the magnetic field region 120 between the vertically oriented pole piece surfaces 114, 116.

Figure 5:
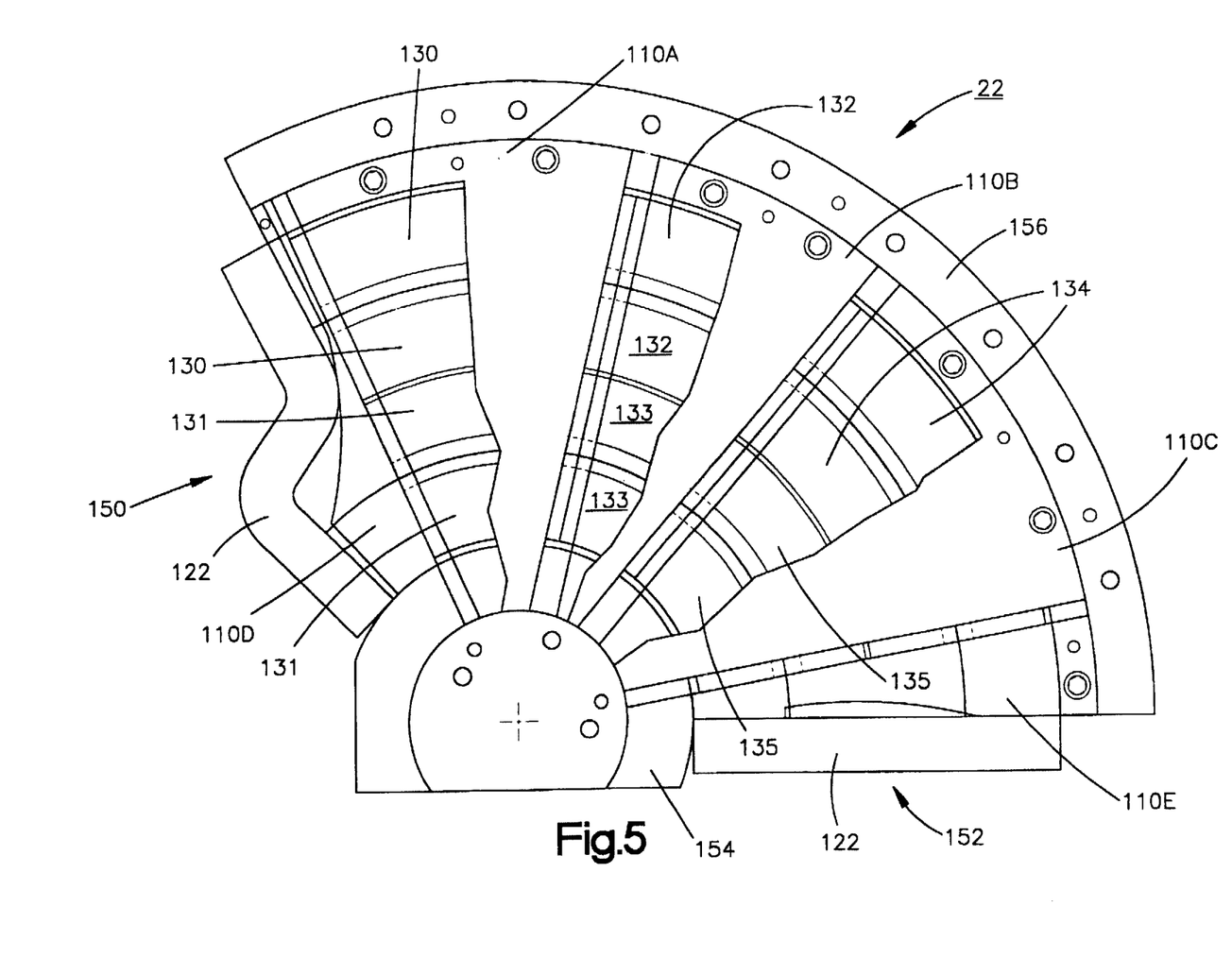
FIG. 5 is a side elevation view on an enlarged scale of the magnet depicted in FIG. 2 as seen from a magnetic field region of the magnet where the field is controlled.

Six additional current carrying coils 130–135 (FIG. 2) provide electric currents through a planar region that extends along one side of the arcuate path followed by the ion beam. Six additional coils are positioned on an opposite side of the beam centerplane 125 in planar symmetric positions and orientations to the six coils 130–135 shown in FIG. 2. Two of these additional six coils 136, 137 are shown in FIGS. 3 and 5. The currents in these coils establish a quadrapole field component in addition to the dipole field B0 in the region 120 between the pole pieces.

The control electronics 100 is electrically coupled to the two primary 122, 123 and the twelve additional current carrying coils of the magnet 22. Appropriate energization of the coils creates a magnetic field having both dipole and quadrapole components in the magnetic field region 120 between the pole piece surfaces 114, 116.

As seen in FIG. 5, the magnet 22 extends along an arcuate sector of approximately 135 degrees from an entrance side 150 of the magnet to an exit side 152 of the magnet 22. The magnet 22 is described as being segmented since the pole pieces are made up of multiple parts or segments that are separated by current carrying coils spaced along the arcuate path of the beam. The pole piece 110 is made up of three intermediate magnet segments 110A, 110B, 110C, an entrance segment 110D and an exit segment 110E.

The three magnetic pole pieces 110A, 110B, 110C are segmented into multiple pole piece segments that widen from a narrow portion on a radially inner portion of the magnet 22 to a relatively wider portion on a radially outer portion of the magnet.

Figure 4:
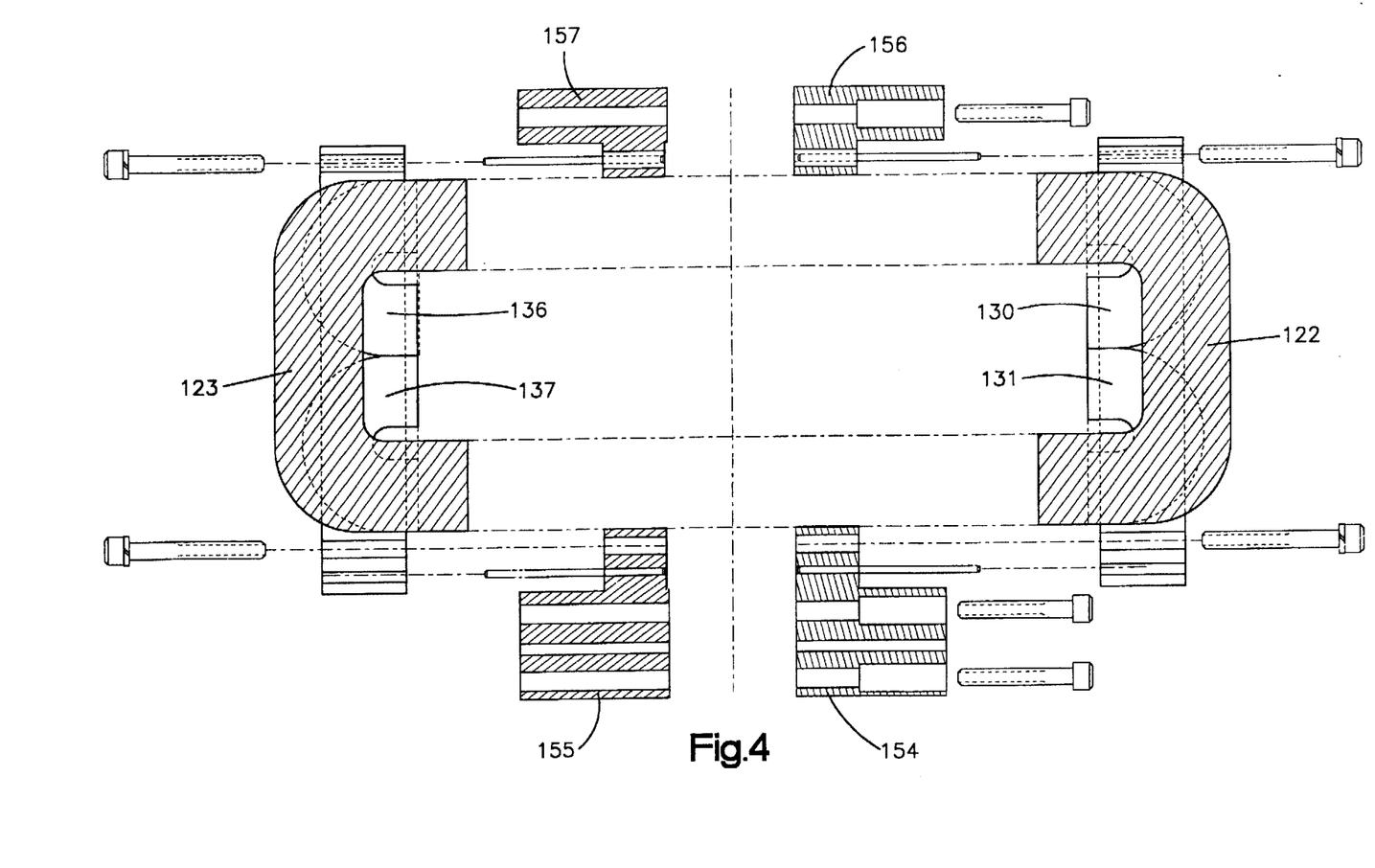
FIG. 4 is an exploded section view of the magnet depicted in FIG. 2.

The five pole piece segments 110A–110E and the corresponding five segments of the pole piece 112 are supported by a two piece hub. The two hub pieces 154, 155 support a radially inner portion of the two magnet pole pieces and a two piece yoke containing two yoke pieces 156, 157 support radially outer portions of the magnet pole pieces.

Both the hub and the yoke are electrically coupled to the grounded housing 32 that supports the magnet 22 and ion source. Since the magnet has pole pieces on opposite sides of the magnet centerplane, with the magnet vertically oriented, it is convenient to refer to magnet portions on the right and the left of the magnetic field region 120. For a magnet that is oriented horizontally it would be equally convenient to refer to top and bottom magnet portions.

Figures 6, 7, 8:
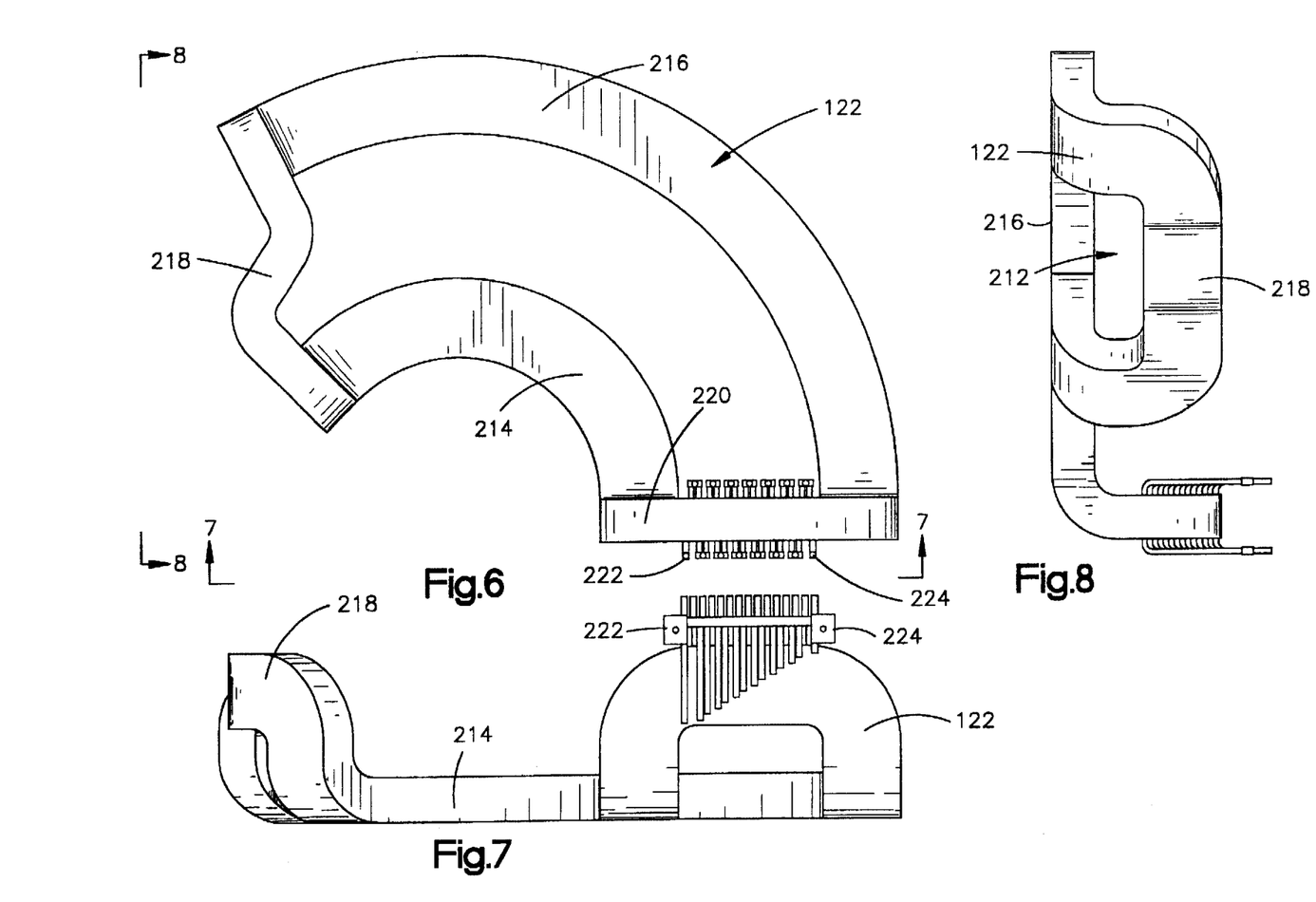
FIG. 6 is a top plan view of a dipole field generating coil that forms a part of the magnet depicted in FIG. 2.
FIG. 7 is a side plan view of the dipole field generating coil as seen from the plane 7—7 of FIG. 6.
FIG. 8 is plan view of the dipole field generating coil as seen from the view 8—8 of FIG. 6.

FIGS. 6–8 depict the coil 122 on the right side of the centerplane 125 as seen from the entrance 150 to the magnet 22. The coil 122 is generally saddleshaped and includes radially inner and outer segments 214, 216 that extend through the complete 135 degree arc of the sector magnet 22. At an entrance 150 to the magnet, the coil 122 has a end segment 218 that bends away from the magnetic field region 120 to define an entryway 212 through which ions enter the magnet field region 120. This coil segment 218 connects together the two radially extending inner and outer coil segments 214, 216 that generally bend along the same arc through which the ion beam bends due to the presence of the magnetic field in the region 120. A coil segment 220 at an exit end of the coil connects together the inner and outer coil segments 214, 216.

The exit segment 220 supports two connectors 222, 224 that are electrically coupled to the electronic control 100 for controlling current flow. Between the connections the coil 122 is made up of multiple layers 230 (eight layers in a preferred embodiment of the invention) of copper tubing that is generally square in cross-section. Within a given layer multiple (preferably 14) side by side arcuate segments of different radius are arranged along the extent of the magnet.

The copper tubing has a center passage through which a liquid coolant can be routed during operation of the ion implanter to remove heat from the coil 122. In a preferred embodiment of the invention the coolant is water and is routed into the coil through one of the two connectors 222, 224 and routed out through a second connector.

The coil 122 is constructed from a single copper tube bent to form the plural layers and multiple arcuate segments of the coil. The copper tubing is constructed by an extrusion process to include a center passageway and is provided in elongated segments. An insulating tape is wrapped around the length of the tubing to insulate the tubing. The insulated tubing is then bent to form the multiple insulated windings of the coil 122.

A direct current bias is applied to the electric connections 222, 224. Current flows down one of the arcuate segments 214, 216 crosses the beam centerline through the segment 218 and returns back to the exit end of the magnet through another of the segments 214, 216. Since the coil 122 is made up of one continuous copper tube, current flows in the same sense from one connector to the other.

Figure 16:
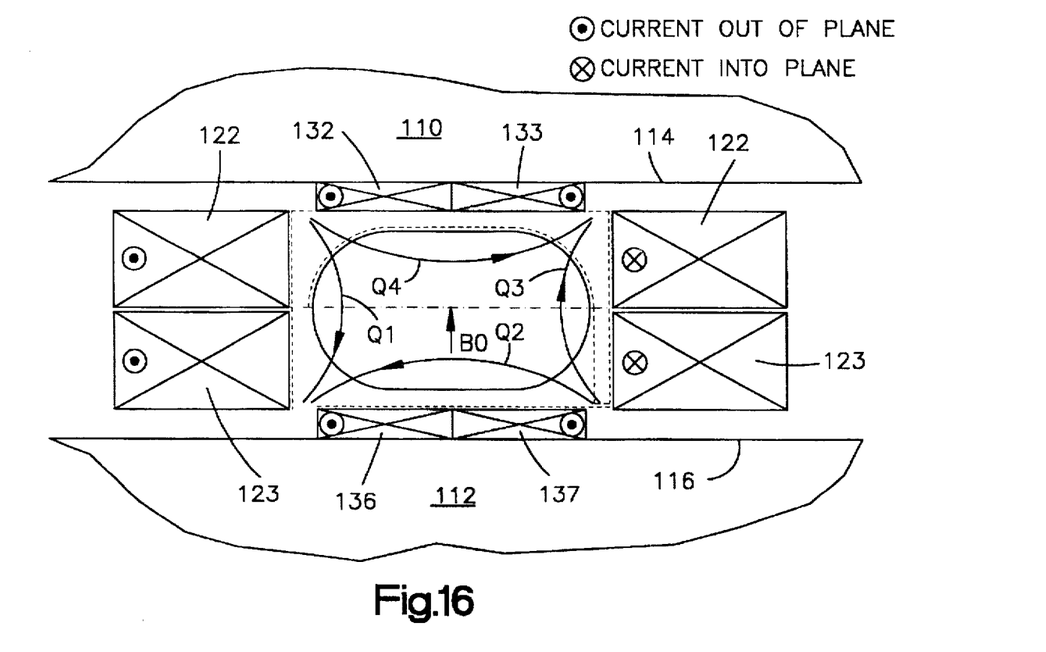
FIG. 16 is a schematic depiction of pole pieces and field generating coils showing the fields between the pole pieces created by controlled energization of the coils.

A second primary coil 123 is constructed similarly to the coil 122. Electrical connectors coupled to the coil 123 are connected to the control electronics 100 so that a controlled current can be routed through the coil 123. The position of the two coils 122, 123 with respect to the magnetic region 120 at a point along the arc of the magnet is depicted in FIG. 16.

Figure 9:
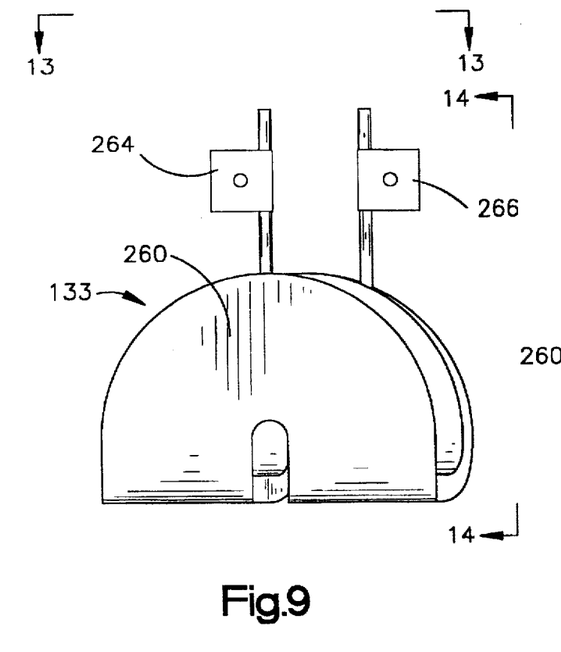
FIG. 9 is a side plan view of a quadrapole field generating coil for use with the magnet shown in FIG. 2.
Figure 10:
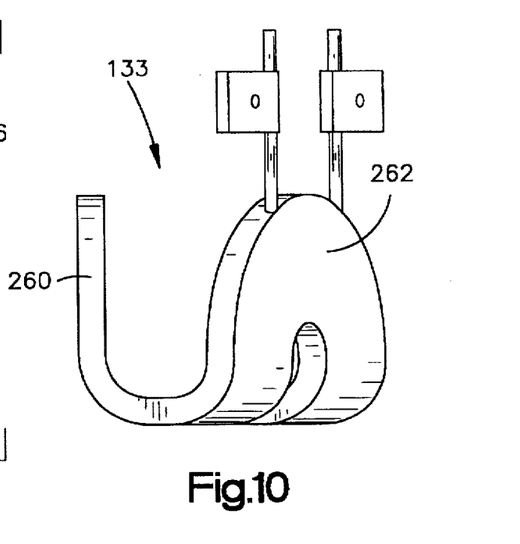
FIG. 10 is a plan view of the quadrapole field generating coil as seen from the view 10—10 in FIG. 9.
Figure 11:
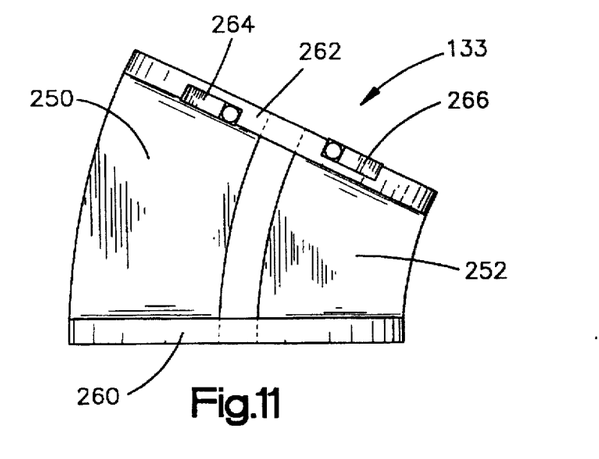
FIG. 11 is a plan view of the quadrapole field generating coil as seen from the view 11—11 in FIG. 9.
Figure 12:
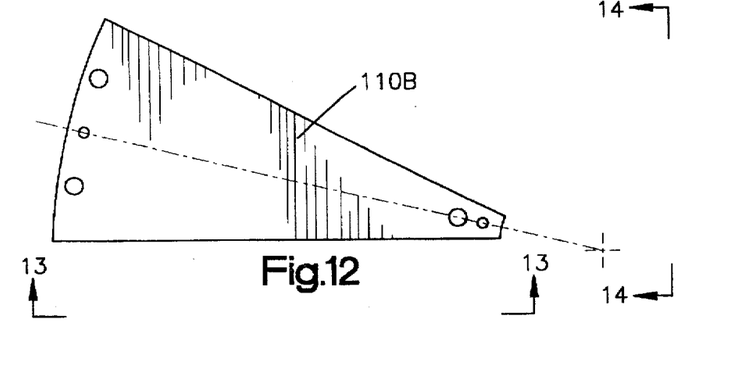
FIG. 12 is a plan view of one of a number of pole pieces used to construct the FIG. 2 magnet.
Figure 13:
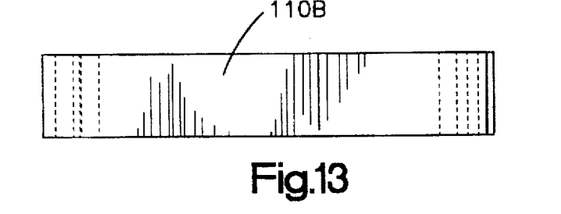
FIG. 13 is a view of the pole piece as seen from the plane 13—13 in FIG. 12.
Figure 14:
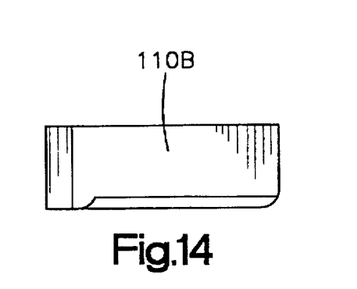
FIG. 14 is a view of the pole piece as seen from the plane 14—14 in FIG. 12.
Figure 15:
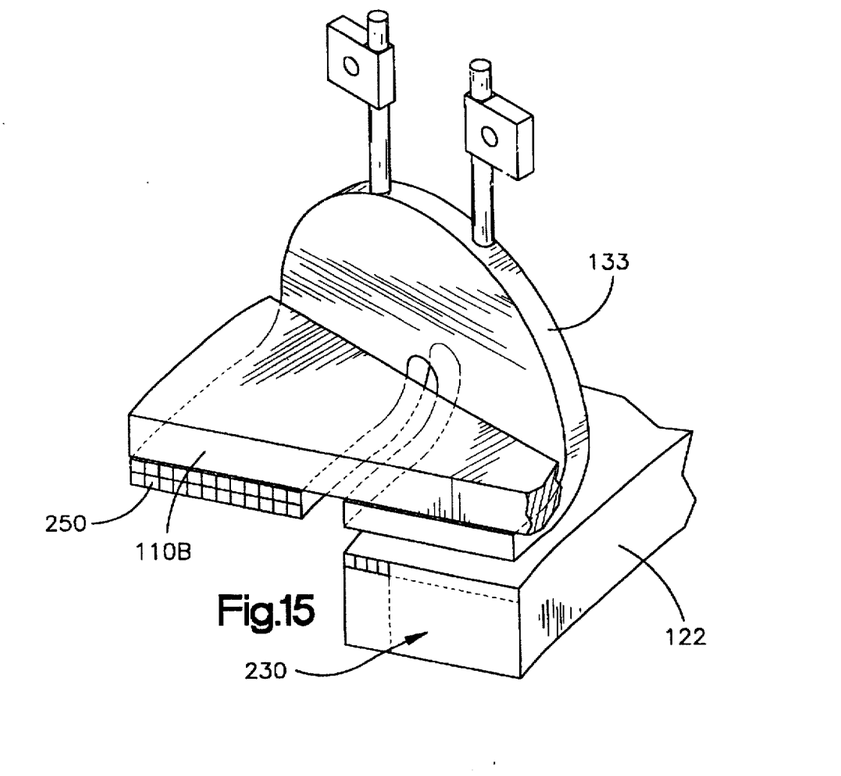
FIG. 15 is a perspective view of a portion of the magnet showing a portion of the dipole coils positioned relative to the quadrapole coils and magnet pole piece.

One of the additional current carrying coils 133 is depicted in greater detail in FIGS. 9–11. This coil 133 bounds the magnet pole piece 110B. The coil 133 is also shaped in the form of a saddle. Two arcuately extending segments 250, 252 are attached by a suitable adhesive to an inwardly facing surface of the pole piece 110B. Semicircular segments 260, 262 connect the arcuately extending segments 250, 252.

The method of construction for the coil 133 is similar to the construction technique for the primary coil 122. An elongated tube is wound or wrapped with an insulator along its length and then bent to form the coil 133. The coil depicted in FIGS. 9–11 has two layers with twelve arcuate sections that extend side by side along the surface of the pole piece 110B to bound the magnetic zone 120. Others of the secondary coils are constructed in a similar manner and are attached to inwardly facing surfaces of the pole pieces 110A, 110B, and 110C.

The coil 133 has input connectors 264, 266 that are electrically energized by the control electronics 100 to control the current through the coil. Additionally, the use of tubing to construct the coils allows coolant to be pumped through the center of the tubing that makes up the coils to transmit heat generated by ions striking the coils away from the coils.

FIG. 16 depicts a view of the primary coils 122, 123 and the secondary coils 132, 133 in the region of the pole piece 110B. The direction of currents flowing through these coils (into and out of the plane of the section through the pole piece 110B) is depicted in this Figure. This current arrangement is controlled by the control electronics 100 which dictates the magnitude and the direction of the current.

The disclosed current arrangement, achieved through controlled coil energization by the control circuit 100, provides a primary magnetic field B0 in the region 120. Four field lines Q1–Q4 representing the quadrapole field are also shown in FIG. 16.

Ions passing through the magnetic field region 120 experience a force. The magnitude of the force on the particle is directly proportional to the velocity and charge of the particle and is in a direction perpendicular to the magnetic field and velocity vectors. (qV×B) In the situation depicted in FIG. 16 a positively charged particle moving into the plane depicted in the Figure will be deflected to the right by the dipole field B0 to follow the arc of the magnet.

The magnetic field vector quantity that the moving charged particle experiences is a superposition of the dipole and the quadrapole fields. To determine the vector force on a moving particle in the field it is necessary to know both the charge and the velocity of the particle. It is not enough, for example, to know which side of the magnet centerplane 125 on which a particle is located to know the force it experiences. One must also know the direction in which the particle is moving.

For the magnetic field configuration shown in FIG. 16 the magnet focusses particles in one plane and defocusses particles in a perpendicular plane. Through used of a segmented magnet having multiple segments of individually controllable magnet coils, a zoom lens effect is possible. This produces a greater percentage of usable ions passing through the beam waist at the region of the aperture 40.

Figure 17:
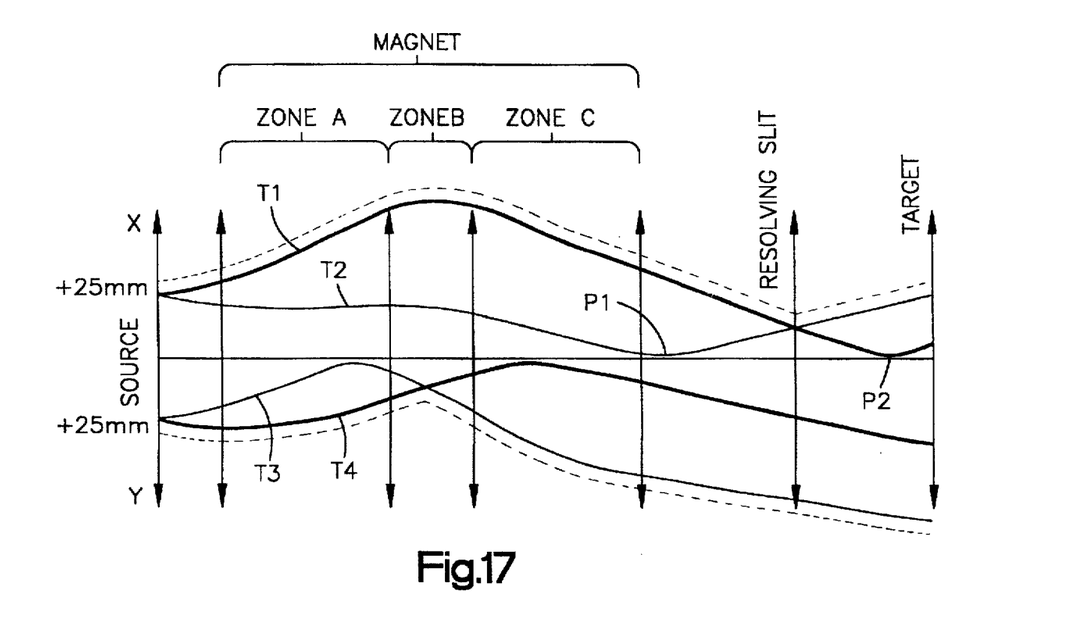
FIG. 17 is a schematic depiction of ion trajectories through the three segments of a segmented magnet constructed in accordance with the present invention.

FIG. 17 illustrates the zoom lens aspect of the segmented magnet. Three magnet segments designated A, B, and C are labeled at the top of the Figure. These three segments correspond to the field set up in the region of the pole piece segments 110A, 110B, 110C shown in FIG. 2. FIG. 17 depicts two different controlled deflections for particles offset from the center of the source arc slit. In this representation the x plane corresponds to the plane of the magnet centerplane 125. The y "plane" is actually curved along the central ray trajectory that passes through the magnet.

In the deflection path depicted at the top of FIG. 17 shows two charged ions leaving the source displaced 25 mm from the magnet center plane and having different velocity vectors. These velocity vectors cause the ions to enter the magnet moving in 'acceptable' trajectories T1, T2 that cause them to pass through the beam waist and strike a target in the implantation chamber. High energy prior art implanters, as noted above had fixed mechanical quadrapole focusing but could not adjust for lower energies, nor could they be readily tuned to enhance dose delivered by the source.

In the FIG. 17 depiction sections A, B, and C alternate in their focussing. A zoom lens effect is achieved by reversing the direction of coil currents in adjacent sections. As seen in FIG. 16 the current for the coils 132, 133, 136, 137 is into the plane of the figure adjacent the magnetic field region 120. These coils help define the quadrapole magnetic field in the 'B' zone. In the 'A' zone the coils 130, 131 that bound the region 120 will have current reversed so that a depiction similar to the FIG. 16 depiction for the 'A' zone would show current into the plane of the figure for the two coils 130, 131.

FIG. 17 shows a pair of trajectories originating from the source at x=25 mm, y=0, and another pair originating at y=25 mm and x=0. The "x" trajectories at the top of the Figure remain in the y=0 plane and show the effects of defocusing, focusing, defocusing in zones A, B, and C respectively.

The "y" trajectories at the bottom of FIG. 17 remain in the x=0 plane, and show the reverse effect of focusing, defocusing, and focusing in the zones A, B, and C respectively. The rays furthest from the axis are shown to be closely bounded by a dotted line 270 to indicate the bounds of the beam envelope.

By selective control over both the magnitude and direction of current flow in the coils, it is possible to focus the beam leaving the source so that a maximum throughput of suitable ion species reaches the target. This will most typically be accomplished by empirical monitoring of the beam current and adjusting the coil currents to maximize that current.

The FIG. 17 depiction shows the ions traversing the two trajectores as being reflected at the x=0 or centerplane co-ordinate at points P1, P2. Because of the symmetry about the 'x' and 'y' planes, it is customary to show the trajectories in one half plane but the ions actually cross the beam centerplane. For example, particles following the trajectory T2 cross the centerplane just after exiting the magnet at the point P1. Two other trajectories T3, T4 are depicted in FIG. 17. These two trajectories correspond to ions displace from the 'y' center of the source by 25 mm moving with different velocities.

While the present invention has been described with a degree of particularity, it is to be understood that those of ordinary skill in the art may make certain modifications to the presently described embodiment of the invention without departing from the spirit or scope of the invention, as set forth in the appended claims.

I claim:
1. A method for filtering particles from an ion beam, the method comprising the steps of:
   a) moving the ion beam through a magnetic field region;
   b) energizing at least one dipole field generating coil to generate a dipole magnetic field in the magnetic field region;
   c) energizing at least one quadrupole field generating coil to generate a quadrupole magnetic field superimposed on the dipole magnetic field in the magnetic field region; and
   d) controlling the energization of the at least one dipole field generating coil and the at least one quadrupole field generating coil to filter particles from the ion beam as the ion beam moves through the magnetic field region.

2. The method of claim 1, wherein the moving step (a) comprises the step of moving the ion beam through a magnetically permeable beam guide traversing the magnetic field region.

3. The method of claim 1, wherein the energizing step (b) comprises the steps of:
   i) energizing a first dipole field generating coil positioned on a first side of a plane bisecting the magnetic field region, and
   ii) energizing a second dipole field generating coil positioned on a second side of the bisecting plane opposite the first side.

4. The method of claim 1, wherein the energizing step (c) comprises the steps of:
   i) energizing a first pair of quadrupole field generating coils positioned on a first side of a plane bisecting the magnetic field region, and
   ii) energizing a second pair of quadrupole field generating coils positioned on a second side of the bisecting plane opposite the first side.

5. The method of claim 1, comprising the step of routing coolant through the at least one dipole field generating coil and the at least one quadrupole field generating coil.

6. The method of claim 1, comprising the steps of passing the filtered ion beam through an aperture of a resolving plate and treating a target with the filtered ion beam.

7. The method of claim 1, wherein the moving step (a) comprises the step of moving the ion beam through at least two sequential zones of the magnetic field region; and
   wherein the energizing step (c) comprises the steps of:
   i) energizing a first set of at least one quadrupole field generating coil to generate a quadrupole magnetic field in one of the zones of the magnetic field region, and
   ii) energizing a second set of at least one quadrupole field generating coil to generate a quadrupole magnetic field in another one of the zones of the magnetic field region.

8. The method of claim 7, wherein the controlling step (d) comprises the step of selectively controlling the energization of the first set of at least one quadrupole field generating coil and the energization of the second set of at least one quadrupole field generating coil.

9. A method for filtering particles from an ion beam, the method comprising the steps of:
   a) moving the ion beam through a magnetic field region;
   b) energizing a first set of at least one conductive coil to generate a first magnetic field in the magnetic field region and define a first one of at least two sequential zones of the magnetic field region;
   c) energizing a second set of at least one conductive coil to generate a second magnetic field in the magnetic field region and define a second one of the zones of the magnetic field region; and
   d) selectively controlling the energization of the first set of at least one conductive coil and the energization of the second set of at least one conductive coil to filter particles from the ion beam as the ion beam moves through the sequential zones of the magnetic field region.

10. The method of claim 9, wherein the moving step (a) comprises the step of moving the ion beam through a magnetically permeable beam guide traversing each sequential zone of the magnetic field region.

11. The method of claim 9, wherein the energization of the first set of at least one conductive coil generates a quadrupole magnetic field in the first zone.

12. The method of claim 9, comprising the step of energizing a third set of at least one conductive coil to generate a magnetic field in the magnetic field region and define a third one of the zones of the magnetic field region; and
   wherein the selectively controlling step (d) comprises the step of selectively controlling the energization of the third set of at least one conductive coil.

13. The method of claim 9, wherein the first set of at least one conductive coil comprises a first pair of conductive coils positioned on a first side of a plane bisecting the magnetic field region and a second pair of conductive coils positioned on a second side of the bisecting plane opposite the first side; and
   wherein the energizing step (b) comprises the step of energizing the first and second pairs of conductive coils of the first set.

14. The method of claim 9, comprising the step of energizing at least one dipole field generating coil for generating a dipole magnetic field in the magnetic field region.

15. The method of claim 9, comprising the step of routing coolant through each of the conductive coils.

16. The method of claim 9, comprising the steps of passing the filtered ion beam through an aperture of a resolving plate and treating a target with the filtered ion beam.

17. An apparatus for filtering particles from an ion beam, the apparatus comprising:
   a) structure for defining a magnetic field region through which the ion beam moves;
   b) a plurality of conductive coils configured with the structure in relation to the magnetic field region for generating both a dipole magnetic field and a quadrupole magnetic field in the magnetic field region to filter particles from the ion beam as the ion beam moves through the magnetic field region; and c) a controller for energizing the plurality of conductive coils to generate the dipole magnetic field and the quadrupole magnetic field superimposed on the dipole magnetic field.

18. The apparatus of claim 17, wherein the structure comprises at least two magnetic pole pieces configured in relation to one another to define the magnetic field region.

19. The apparatus of claim 17, wherein the structure comprises a magnetically permeable beam guide positioned to traverse the magnetic field region and wherein the ion beam moves through the beam guide.

20. The apparatus of claim 17, wherein the plurality of conductive coils comprise a first dipole field generating coil positioned on a first side of a plane bisecting the magnetic field region and a second dipole field generating coil positioned on a second side of the bisecting plane opposite the first side.

21. The apparatus of claim 17, wherein the plurality of conductive coils comprise a first pair of quadrupole field generating coils positioned on a first side of a plane bisecting the magnetic field region and a second pair of quadrupole field generating coils positioned on a second side of the bisecting plane opposite the first side.

22. The apparatus of claim 17, wherein one of the plurality of conductive coils comprises a first radial segment and a second radial segment each extending along an arcuate travel path of the ion beam.

23. The apparatus of claim 17, wherein one of the plurality of conductive coils comprises conductive tubing configured in a plurality of layers, each layer comprising a plurality of arcuate segments having different radii.

24. The apparatus of claim 17, wherein each of the plurality of conductive coils comprises tubing having a passageway for routing coolant.

25. The apparatus of claim 17, in combination with an ion source for generating ions to create the ion beam, a resolving plate having an aperture through which the filtered ion beam passes, and an ion implantation station for treating a target with the filtered ion beam.

26. The apparatus of claim 17, wherein the structure configured with the plurality of conductive coils defines at least two sequential zones of the magnetic field region through which the ion beam moves, and wherein the plurality of conductive coils comprise a first set of at least one quadrupole field generating coil to generate a quadrupole magnetic field in one of the zones of the magnetic field region and a second set of at least one quadrupole field generating coil to generate a quadrupole magnetic field in another one of the zones of the magnetic field region.

27. The apparatus of claim 26, wherein the controller selectively controls the energization of the first set of at least one quadrupole field generating coil and the energization of the second set of at least one quadrupole field generating coil.

28. An apparatus for filtering particles from an ion beam, the apparatus comprising:
a) magnetic field generating means for defining a magnetic field region through which the ion beam moves and for generating a magnetic field in the magnetic field region to filter particles from the ion beam as the ion beam moves through the magnetic field region, the magnetic field generating means comprising a plurality of conductive coils for generating both a dipole magnetic field and a quadrupole magnetic field in the magnetic field region; and
b) control means, coupled to the magnetic field generating means, for energizing the plurality of conductive coils to generate the dipole magnetic field and the quadrupole magnetic field superimposed on the dipole magnetic field.

29. The apparatus of claim 28, wherein the plurality of conductive coils comprise a first dipole field generating coil positioned on a first side of a plane bisecting the magnetic field region and a second dipole field generating coil positioned on a second side of the bisecting plane opposite the first side.

30. The apparatus of claim 28, wherein the plurality of conductive coils comprise a first pair of quadrupole field generating coils positioned on a first side of a plane bisecting the magnetic field region and a second pair of quadrupole field generating coils positioned on a second side of the bisecting plane opposite the first side.

31. An apparatus for filtering particles from an ion beam, the apparatus comprising:
a) structure for defining a magnetic field region through which the ion beam moves;
b) a first set of at least one conductive coil configured with the structure for generating a magnetic field in the magnetic field region to define a first one of at least two sequential zones of the magnetic field region;
c) a second set of at least one conductive coil configured with the structure for generating a magnetic field in the magnetic field region to define a second one of the zones of the magnetic field region; and
d) a controller for selectively energizing the first set of at least one conductive coil and the second set of at least one conductive coil to filter particles from the ion beam as the ion beam moves through the sequential zones of the magnetic field region.

32. The apparatus of claim 31, wherein the structure comprises a pair of magnetic pole pieces configured in relation to one another with the first set of at least one conductive coil to define the first zone of the magnetic field region.

33. The apparatus of claim 31, wherein the structure comprises a magnetically permeable beam guide positioned to traverse each sequential zone of the magnetic field region and wherein the ion beam moves through the beam guide.

34. The apparatus of claim 31, wherein the first set of at least one conductive coil generates a quadrupole magnetic field in the first zone.

35. The apparatus of claim 31, comprising a third set of at least one conductive coil configured with the structure for generating a magnetic field in the magnetic field region to define a third one of the zones of the magnetic field region; and wherein the controller selectively energizes the third set of at least one conductive coil.

36. The apparatus of claim 31, wherein the first set of at least one conductive coil comprises a first pair of conductive coils positioned on a first side of a plane bisecting the magnetic field region and a second pair of conductive coils positioned on a second side of the bisecting plane opposite the first side.

37. The apparatus of claim 31, comprising at least one dipole field generating coil configured with the structure in relation to the magnetic field region for generating a dipole magnetic field in the magnetic field region.

38. The apparatus of claim 31, wherein each of the conductive coils comprises a first radial segment and a second radial segment each extending along an arcuate travel path of the ion beam.

39. The apparatus of claim 31, wherein each of the conductive coils comprises conductive tubing configured in a plurality of layers, each layer comprising a plurality of arcuate segments having different radii.

40. The apparatus of claim 31, wherein each of the conductive coils comprises tubing having a passageway for routing coolant.

41. The apparatus of claim 31, in combination with an ion source for generating ions to create the ion beam, a resolving plate having an aperture through which the filtered ion beam passes, and an ion implantation station for treating a target with the filtered ion beam.

42. An apparatus for filtering particles from an ion beam, the apparatus comprising:

a) magnetic field generating means for defining at least two sequential zones for a magnetic field region through which the ion beam moves and for generating a magnetic field in the sequential zones of the magnetic field region to filter particles from the ion beam as the ion beam moves through the sequential zones of the magnetic field region, the magnetic field generating means comprising:

i) a first set of at least one conductive coil for generating a magnetic field in the magnetic field region to define a first one of the zones of the magnetic field region, and         ii) a second set of at least one conductive coil for generating a magnetic field in the magnetic field region to define a second one of the zones of the magnetic field region; and     b) control means, coupled to the magnetic field generating means, for selectively energizing the first set of at least one conductive coil and the second set of at least one conductive coil.

43. The apparatus of claim 42, wherein the first set of at least one conductive coil generates a quadrupole magnetic field in the first zone.

44. The apparatus of claim 42, wherein the magnetic field generating means comprises a third set of at least one conductive coil for generating a magnetic field in the magnetic field region to define a third one of the zones of the magnetic field region; and     wherein the control means selectively energizes the third set of at least one conductive coil.

45. The apparatus of claim 42, wherein the first set of at least one conductive coil comprises a first pair of conductive coils positioned on a first side of a plane bisecting the magnetic field region and a second pair of conductive coils positioned on a second side of the bisecting plane opposite the first side.

46. The apparatus of claim 42, wherein the magnetic field generating means comprises at least one dipole field generating coil for generating a dipole magnetic field in the magnetic field region.

\* \* \* \* \*